United States Patent [19]
Bailey et al.

[11] Patent Number: 5,204,804
[45] Date of Patent: Apr. 20, 1993

[54] GTO MODULE WITH PIGGYBACK BYPASS DIODE

[75] Inventors: Ronald B. Bailey; Stephen T. Radack, both of Erie, Pa.

[73] Assignee: General Electric Company, Erie, Pa.

[21] Appl. No.: 821,517

[22] Filed: Jan. 15, 1992

[51] Int. Cl.$^5$ .................................. H05K 7/20
[52] U.S. Cl. .................................. 361/386; 361/407; 361/388; 363/141; 363/144; 257/718
[58] Field of Search ............. 174/16.3; 165/80.3, 165/185; 307/150; 357/79, 81; 361/386–389, 407; 363/141, 144

[56] References Cited

U.S. PATENT DOCUMENTS

| | | | |
|---|---|---|---|
| 4,288,728 | 9/1981 | Numi et al. | 361/386 |
| 4,455,597 | 6/1984 | Vukasovic | 363/144 |
| 4,896,062 | 1/1990 | Pollard | 363/141 |
| 5,072,332 | 12/1991 | Abe | 363/141 |

FOREIGN PATENT DOCUMENTS

| | | | |
|---|---|---|---|
| 2926403 | 6/1979 | Fed. Rep. of Germany. | |
| 2301955 | 9/1976 | France | 363/144 |
| 0089062 | 5/1983 | Japan | 363/144 |

Primary Examiner—Gregory D. Thompson
Attorney, Agent, or Firm—R. Thomas Payne

[57] ABSTRACT

A power supply has a stack formed by a first bus plate, a gate take off (GTO) thyristor, a second bus plate, a bypass diode and a third bus plate all mounted to a heat sink by a single clamp, with the anode of the thyristor closest to the heat sink. Preferably, the bus plates are sized and of a material to provide local thermal storage. The heat sink then can be sized to handle only the average heat dissipation requirements, rather than the peak requirements, and the total power supply can be very compact.

17 Claims, 2 Drawing Sheets

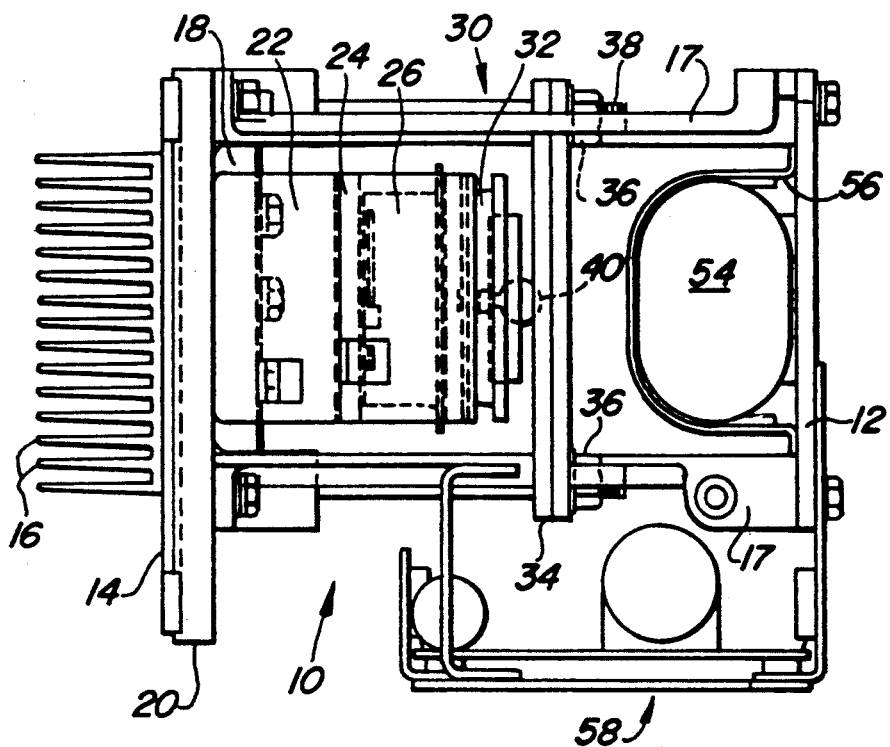
Fig. 3
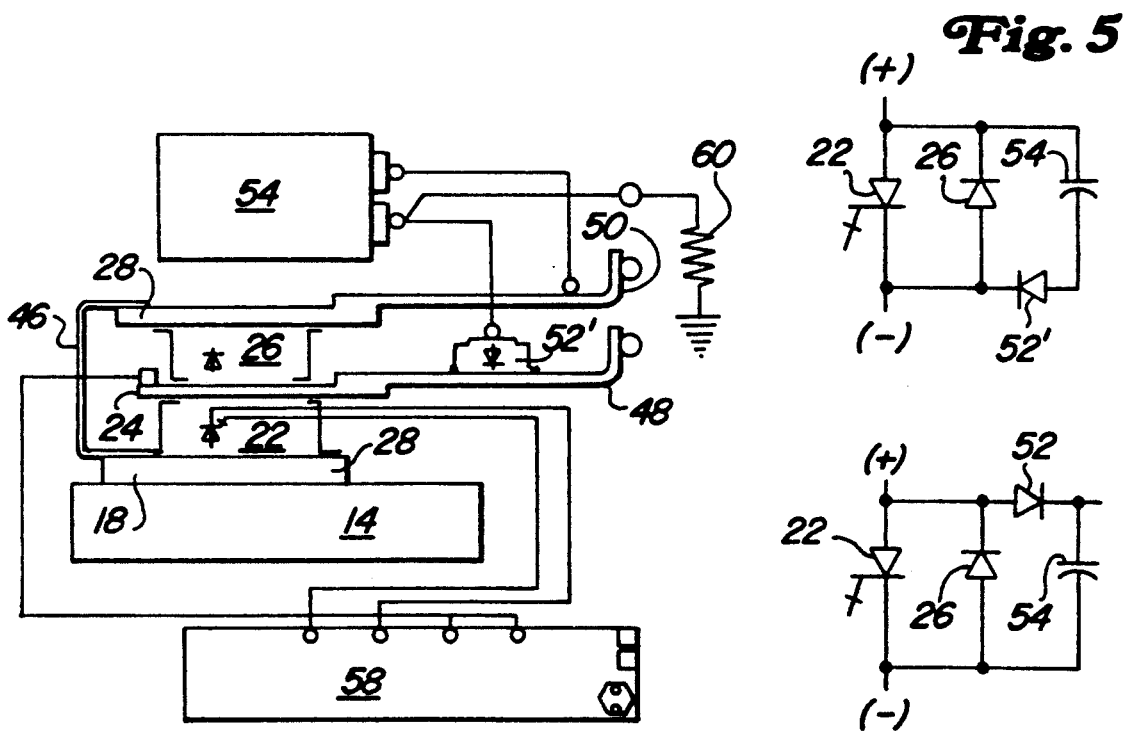
Fig. 4
Fig. 5
Fig. 6

GTO MODULE WITH PIGGYBACK BYPASS DIODE

BACKGROUND OF THE INVENTION

1. Field of the Invention

The present invention relates to mounting arrangements for high voltage/high power semiconductors, and in particular for GTO thyristors with bypass diodes.

2. Description of the Related Art

Traction vehicles such as rail transit vehicles are frequently powered by either direct current (DC) or alternating current (AC) electric motors. The power developed by such motors may be as high as 1000 horsepower (HP) per motor. Such high HP motors require commensurately high, controlled electric power. For example, a nominal power requirement may be 750 volts at 1000 amperes when the motor is operated in a propulsion mode. The motors also typically are used for electrical braking of the traction vehicle by operating them as generators, which may produce even higher voltages and currents. In the case of an AC electric motor operating as a generator, the peak voltage routinely exceeds 1000 volts.

Power control systems for such electric traction motors typically use power semiconductor devices, such as gate turn off (GTO) thyristors, to control power flow to and from the motors. Due to the magnitude of the power being controlled, there is a significant amount of heat that must be dissipated by the semiconductor devices. This heat is generally dissipated by mounting the semiconductors on relatively large heat sinks. The heat sinks are metal conductors having good thermal characteristics and sufficient surface area to dissipate sufficient heat to maintain the semiconductors within their operating temperature limits.

The semiconductors are connected to high potentials. For many applications, it is desirable for safety reasons that such large heat sinks be maintained at electrical ground potential. Thus, some form of electrical insulation may be provided between the semiconductors and the heat sinks. However, any such electrical insulation must be a good thermal conductor, since it is positioned between the semiconductors and the heat sink. The insulation conventionally used is a sheet material available under the trade name of Chotherm, which is believed to be a boron nitride material with a silicon binder. In a conventional application, each semiconductor is clamped to the heat sink, with the Chotherm sheet clamped therebetween.

The AC traction drive power supply commonly used in transit vehicles is a voltage source pulse width modulated GTO thyristor inverter. The switching is done by the GTO thyristor, but a bypass diode is placed in antiparallel across the GTO thyristor due to the inductive nature of the traction motor load. A snubber diode and snubber capacitor also are normally needed to limit voltage during turn off. Finally, a remotely located resistor normally is connected to dissipate the energy trapped in the capacitor.

Semiconductors of this power requirement are preferably packaged in "press packs" in which the cathode and anode terminals are large flat surfaces on opposite ends of the semiconductors. The GTO thyristor and diode commonly are mounted to the heat sink side by side using separate clamps. This side by side mounting of the already large press packs requires a large heat sink and a large area of insulating material.

SUMMARY OF THE INVENTION

It is the object of the present invention to provide a mounting arrangement for a GTO thyristor and its bypass diode which minimizes the surface area of the insulating material required, reduces the size of the heat sink required, reduces the number of clamps required and provides a highly compact total package.

These objects are achieved according to the present invention by piggybacking the bypass diode on top of the GTO thyristor, rather than mounting them to the heat sink side by side. Thick bus plates on the top of the bypass diode and bottom of the GTO thyristor simultaneously serve as electrical connections and local thermal storage. If desired, a bus plate between the bypass diode and the GTO thyristor also can be thickened to act as additional local thermal storage.

The present invention recognizes that the bypass diode dissipates only a fraction of the power of the GTO thyristor, and that the bypass diode can operate at higher temperatures than the GTO thyristor. Thus, the bypass diode does not need as effective a connection with the heat sinks as the GTO thyristor.

The present invention also recognizes that the power supply mounting structure used in transit vehicles can benefit from the nature of the transit vehicle's duty cycle operation. It is common for the peak rate of power dissipation in a GTO thyristor used in a transit application to be more than five times the average rate of power dissipation, with a typical duty cycle repeating every one to two minutes. Thus, by providing local thermal storage, the present invention allows the heat sinks for the entire power supply package to be sized to dissipate heat at only the average rate, which is substantially smaller than what would be necessary to dissipate the peak load.

If needed for a particular application, the conventional layer of electrically insulating, thermally conducting material still can be positioned between the bottom bus plate and the heat sink, but it can be much smaller, since it now need only insulate the GTO thyristor, not both the GTO thyristor and the bypass diode. In addition, the piggybacked GTO thyristor and bypass diode can be mounted to the heat sink with a single clamp, instead of the two clamps conventionally required for side by side mounting.

If desired, the snubber diode also can be stacked with the other components, since they are even less sensitive to temperature than the bypass diode.

BRIEF DESCRIPTION OF THE DRAWINGS

The invention will be described in greater detail with reference to the drawings, in which:

FIG. 3 is a view along line 3—3 in FIG. 1.

FIG. 4 is a conceptual View of the layout and electrical connections of the components shown in FIG. 1.

FIGS. 5 and 6 are alternative electrical schematics for a power supply according to the present invention.

DETAILED DESCRIPTION OF THE PREFERRED EMBODIMENTS

Figure 1:
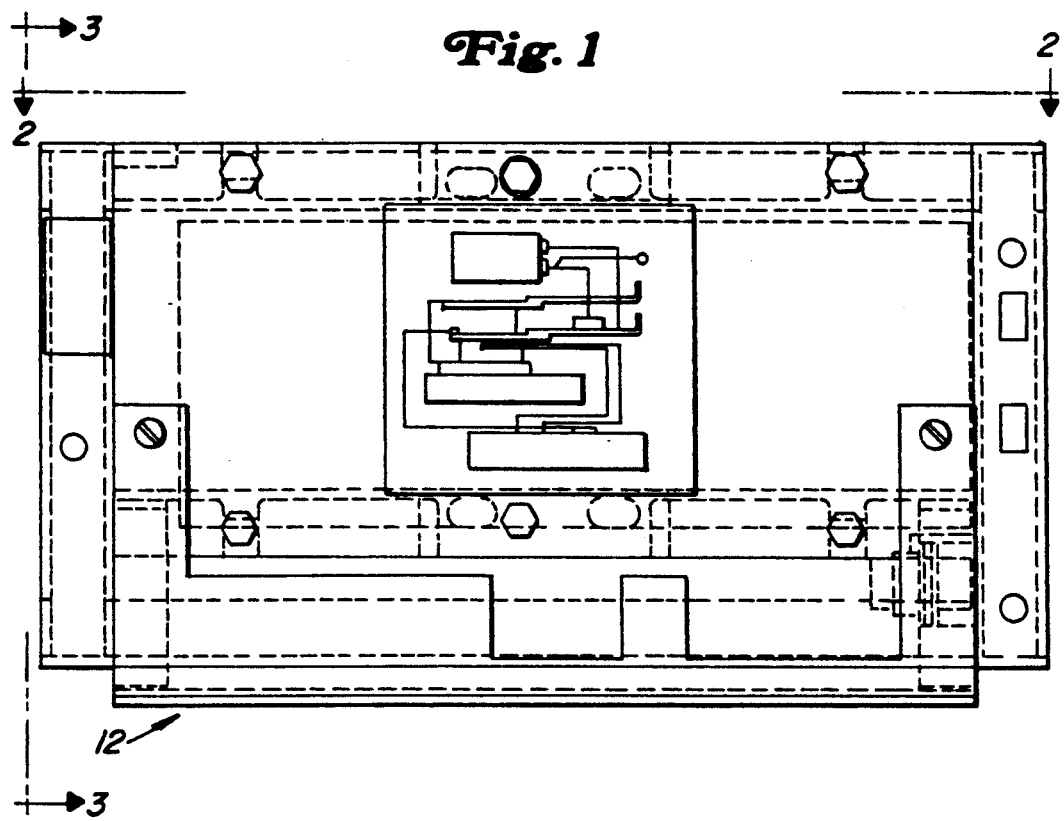
FIG. 1 is a plan view of a side mounting panel of a power supply and support structure according to the present invention.
Figure 2:
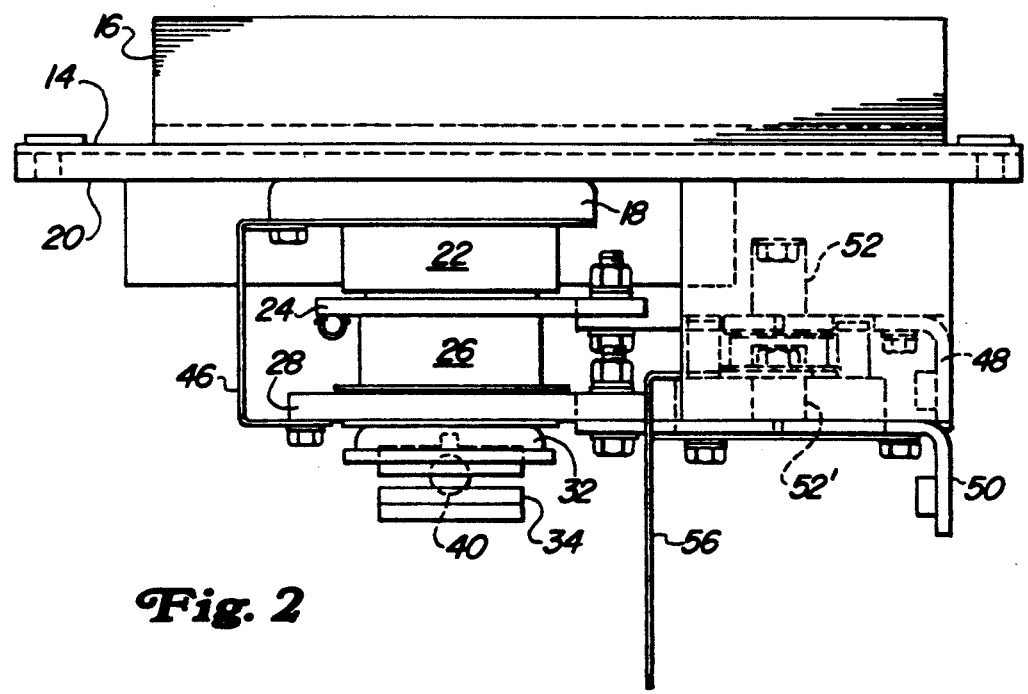
FIG. 2 is a view along line 2—2 in FIG. 1 with the side sheet removed.

A power supply 10 best seen in FIGS. 2 and 3 is mounted to a support panel 12, which is best seen in FIG. 1. The support panel 12 is provided with bolt holes, flanges or other mechanisms for mounting the entire power supply 10 in a suitable location, e.g., a transit vehicle.

A heat sink 14 having a plurality of heat dissipation fins 16 is held spaced from the support panel 12 by suitable support brackets 17. A substantially flat first bus plate 18 is positioned next to and is thermally connected to the heat sink 14. The first bus plate 18 can rest directly against the heat sink 14, but preferably is separated from it by a sheet 20 of thermally conducting, but electrically insulating material, e.g., Chotherm, to keep the heat sink 14 from being raised to a high voltage.

A press pack-type gate turn off (GTO) thyristor 22 rests against the first bus plate 18, with the anode of the GTO thyristor 22 electrically connected to the first bus plate 18. The first bus plate 18 preferably has a larger surface area than the GTO thyristor 22 to spread out the heat flow to the heat sink 14. This simultaneously allows the heat sink 14 to operate more efficiently and minimizes the likelihood of electrical channeling through the sheet insulation 20 at hot spots.

A substantially flat second bus plate 24 rests against the GTO thyristor 22, with the cathode of the GTO thyristor 22 electrically connected to the second bus plate 24. A press pack-type bypass diode 26 rests against the second bus plate 24, with the anode of the bypass diode 26 electrically connected to the second bus plate 24. A substantially flat third bus plate 28 rests against the bypass diode 26, with the cathode of the bypass diode 26 electrically connected to the third bus plate 28.

A clamp shown generally at 30 holds the stack made up of the first bus plate 18, insulating sheet 20 (if any), GTO thyristor 22, second bus plate 24, bypass diode 26 and third bus plate 28 against the heat sink 14. Any suitable clamp may be used for this purpose.

The clamp 30 shown in FIG. 3 has a plastic insulator 32 which is pressed against the third bus plate 28 by a compression spring 34. The other side of the spring 34 is held in place by nuts 36 on bolts 38 which are mounted in the heat sink 14. A suitable depression or other mechanism preferably is provided to ensure centering of the plastic insulator relative to the press-packs. Similarly, the plastic insulator 32 preferably is provided with a centering ball 40 to center it relative to the spring 34.

As shown in FIG. 2, a strap 46 electrically connects the first and third bus plates 18, 28. The second and third bus plates 24, 28 also are connected to extension plates 48, 50, respectively, to provide electrical connections outside of the power supply 10. In use, one of the extension plates 48, 50 would be connected to an AC line in, and one to a DC line out. Which is which depends on the wiring configuration (discussed below).

Either a snubber diode 52 is mounted to extension plate 48 with its anode electrically connected to the extension plate 48, or a snubber diode 52, is mounted to extension plate 50 with its cathode electrically connected to extension plate 50, depending on the wiring configuration (discussed below).

As best seen in FIG. 3, a snubber capacitor 54 is mounted between the clamp 30 and the support panel 12. It may be held in place by any suitable means, e.g., a bracket 56. Its terminals are electrically connected between the DC line out and the cathode of snubber diode 52 or the anode of snubber diode 52'.

A suitable control mechanism 58 for controlling the GTO thyristor 22 preferably is mounted as part of the power supply 10. Such control mechanisms are known in the art and will not be described further here.

The various bus plates 18, 24, 28 preferably are in thermal contact with the adjacent GTO thyristor 22 and bypass diode 26, and are sized and of a material such that they act as local thermal storage. The bus plates 18, 24, 28 then can store heat when the power supply is peak power demands, and dissipate it to the heat sink 14 at an average rate.

If sufficient local thermal storage is provided, the heat sink 14 can be sized to dissipate only the heat generated on average over the duty cycle of the power supply 10, rather than the heat generated at peak power. This means the heat sink 14 can be considerably smaller than in a conventional structure.

In a typical transit application, the duty cycle is on the order of a minute or two. The commercially available GTO thyristors of this capacity generally have a thermal time constant of a few seconds. Sizing the bus plates so that they will provide local thermal storage with a thermal time constant on the order of a few tens of seconds should allow the heat sink 14 to be sized for just the average heat dissipation requirements of the power supply 10. Thick copper plates can meet these requirements in a typical applications.

FIG. 4 shows a conceptual view of the relative positions and wiring connections of the components just described, in the embodiment with the cathode of snubber diode 52' connected to extension plate 48, and the snubber capacitor 54 connected between the anode of snubber diode 52' and extension plate 50. In this embodiment, extension plate 48 would be connected to AC line in, and extension plate 50 would be connected to DC line out.

In the alternative embodiment mentioned above (but not shown in FIG. 4), the anode of snubber diode 52 would be connected to extension plate 50 and the snubber capacitor 54 would be connected between the cathode of snubber diode 52 and extension plate 48. Extension plate 48 would be connected to DC line out, and extension plate 50 to AC line in.

This conceptual representation also shows a drain resistor 60 connected between ground and the terminal of the snubber capacitor 54 which is also connected to the snubber diode 52 or 52' to dissipate the energy trapped in the snubber capacitor 54. Such a resistor 60 typically is located remotely from the power supply 10.

FIGS. 5 and 6 show the alternative wiring connections just described in their most basic schematic forms (with the control mechanism 58 for the GTO thyristor 22 omitted). In a normal application, a transit vehicle would be provided with two power supplies 10, one wired as shown in each of FIGS. 5 and 6, to capture power in both halves of the AC power cycle.

While the invention has been described in conjunction with a specific embodiment, it is to be understood that many alternatives, modifications and variations will be apparent to those skilled in the art in light of the foregoing description. Accordingly, this invention is intended to embrace all such alternatives, modifications and variations which fall within the spirit and scope of the appended claims.

We claim:

1. A structure for mounting a power supply, the power supply having a thyristor with a first face and a second face opposite from the first face, and a bypass diode with a first face and a second face opposite from the first face, the structure comprising:

a heat sink;

a first bus plate having a first face contiguous to and thermally connected to the heat sink, and a second face opposite from the first face and engaging the thyristor first face;

a second bus plate having a first face operatively contacting the thyristor second face, and a second face opposite from the second face and engaging the bypass diode first face;

a third bus plate having a first face operatively contacting the second face of the bypass diode second face, and a second face opposite from the first face; and clamp means, operatively connected to the heat sink, for connecting the bus plate, the thyristor, the second bus plate, the bypass diode and the third bus plate to the heat sink, wherein at least one of the bus plates has a size and consists of a material sufficient to provide local thermal storage to allow the heat sink to be only of a size suitable to dissipate the average heat flow through the power supply.

2. The structure of claim 1, wherein the first and the third bus plates comprises copper plates sized to provide the local thermal storage.

3. The structure of claim 1, wherein the clamping means comprises a spring clamp for pressing the third bus plate second face toward the heat sink.

4. The structure of claim 1, further comprising:

a sheet of thermally conducting, electrically insulating material operatively positioned between the first bus plate first face and the heat sink.

5. The structure of claim 1, wherein the first bus plate is larger in area than the thyristor first face.

6. The structure of claim 1, wherein the power supply further comprises: a snubber capacitor.

7. The structure of claim 6, wherein the power supply further comprises a snubber diode.

8. A power supply for operatively connecting at least one AC line in and at least one DC line out, the power supply comprising:

a heat sink;

a first bus plate having a first face contiguous to and thermally connected to the heat sink and a second face opposite from the first face, the first bus plate being electrically connected to one of the AC line in and one of the DC line out;

a gate turn off thyristor having a first face operatively connecting the first bus plate second face, and a second face opposite from the first face, the anode of the thyristor being electrically connected to the first bus plate;

a second bus plate having a first face operatively connecting the thyristor second face and a second face opposite from the first face, the second bus plate being electrically connected to the cathode of the thyristor and to another at the AC line in and the DC line out;

a bypass diode having a first face operatively connecting the second bus plate second face and a second face opposite from the first face, the anode of the bypass diode being electrically connected to the second bus plate;

a third bus plate having a first face operatively connecting the bypass diode second face and a second face opposite from the first face, the third bus plate being electrically connected to the cathode of the bypass diode and to the first bus plate;

clamping means, mounted to the heat sink, for clamping a stack formed by the first bus plate, the thyristor, the second bus plate, the bypass diode, and the third bus plate to the heat sink;

a snubber diode having its anode electrically connected to the AC line in when the third bus plate is connected to the AC line in and its cathode connected to the AC line in when the second bus plate is connected to the AC line in;

snubber diode support means for holding the snubber diode adjacent to the clamping means;

a snubber capacitor connected between the DC line out and the one of the anode and cathode of the snubber diode which is not connected to the AC line in; and snubber capacitor support means for holding the snubber capacitor adjacent to the clamping means.

9. The power supply to claim 8, further comprising:

a drain resistor connected between ground and the terminal of the snubber capacitor connected to the snubber diode.

10. The power supply of claim 8, wherein the thyristor is a gate turn off thyristor, and further comprising control means for controlling activation of the gate turn off thyristor.

11. The power supply of claim 8, wherein the thyristor and the bypass diode are press packs.

12. The power supply of claim 8, wherein the bus plates are substantially flat.

13. The power supply of claim 8, wherein at least one of the bus plates has a size and consists of a material such that the plates serve to provide sufficient local thermal storage to allow the heat sink to be only of a size suitable to dissipate the average heat flow through the power supply.

14. The power supply of claim 13, wherein the thermal heat constant of the thyristor is on the order of a few seconds, and the thermal heat constant of the local thermal storage is on the order of a few tens of seconds.

15. The power supply of claim 8, further comprising:

a support plate to which the heat sink is mounted and having mounting means for mounting the power supply to a vehicle.

16. The structure of claim 6 further comprising:

support means for holding the capacitor adjacent to the clamp means on the side of the clamp opposite the heat sink.

17. The structure of claim 16 further comprising:

support means for holding the snubber diode adjacent to the clamp means.

* * * * *